United States Patent
Choi et al.

(10) Patent No.: US 10,317,496 B2
(45) Date of Patent: Jun. 11, 2019

(54) MAGNETIC RESONANCE IMAGING APPARATUS AND CONTROL METHOD FOR RECONSTRUCTION OF UNDERSAMPLED DATA

(71) Applicant: SAMSUNG ELECTRONICS CO., LTD., Suwon-si (KR)

(72) Inventors: Sang Cheon Choi, Seoul (KR); Joon Soo Kim, Seoul (KR); Yeol Min Seong, Seoul (KR); Yang Lim Choi, Seongnam-si (KR); Praveen Gulaka, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 792 days.

(21) Appl. No.: 14/501,195

(22) Filed: Sep. 30, 2014

(65) Prior Publication Data

US 2015/0160319 A1 Jun. 11, 2015

(30) Foreign Application Priority Data

Dec. 10, 2013 (KR) ........................ 10-2013-0152884

(51) Int. Cl.
*G01R 33/561* (2006.01)

(52) U.S. Cl.
CPC ................. *G01R 33/5611* (2013.01)

(58) Field of Classification Search
CPC ................................................ G01R 33/5611
USPC ........................................................ 324/309
See application file for complete search history.

(56) References Cited

U.S. PATENT DOCUMENTS

2013/0088225 A1* 4/2013 Weller ............... G01R 33/5611
324/307

FOREIGN PATENT DOCUMENTS

| JP | 2009-268901 A | 11/2009 | |
|---|---|---|---|
| KR | 10-0656156 A | 12/2006 | |
| KR | 10-2010-0004321 A | 1/2010 | |
| KR | 10-1282124 B1 | 7/2013 | |
| WO | WO 2012117303 A1 * | 9/2012 | ......... G01R 33/4804 |

OTHER PUBLICATIONS

Awate et al., Spatiotemporal Dictionary Learning for Undersampled Dynamic MRI Reconstruction via Joint Frame-Based and Dictionary-Based Sparsity, 2012, IEEE, pp. 318-321.*

(Continued)

*Primary Examiner* — Susan S Lee
(74) *Attorney, Agent, or Firm* — Sughrue Mion, PLLC

(57) ABSTRACT

An MRI apparatus includes: a receive coil assembly including channels, and configured to receive an MR signal from an object; a data generator configured to generate undersampled image data on a k-space based on the MR signal; and a reconstructed image generator configured to generate a first reconstructed image from the undersampled image data using a parallel imaging method, and a second reconstructed image from the undersampled image data using compressed sensing. According to the MRI apparatus, since image reconstruction is performed using random undersampled image data, a parallel imaging method, and compressed sensing, it is possible to increase a speed of image acquisition and, at the same time, to improve the quality of images.

12 Claims, 17 Drawing Sheets

(56) References Cited

OTHER PUBLICATIONS

Chang et al., Compressed Sensing MRI with Multichannel Data Using Multicore Processors, 2010, Magnetic Resoance in Medicine 64:1135-1139.*

Lu et al., Few-View Image Reconstruction with Dual Dictionaries, 2012, Phys Med Biol, 57(1): 173-189.*

Rubinstein et al., Efficient Implementation of the K-SVD Algorithm using Batch Orthogonal Matching Pursuit, 2008, Technion.*

Lu and Yang, Super-resolution Reconstruction of Dynamic MRI by Patch Learning, 2012 12th International Conference on Control, Automation, Robotics & Vision, Dec. 2012.*

Communication dated Mar. 2, 2016 by the Korean Intellectual Patent Office in related Application No. 10-2013-0152884.

Communication dated Sep. 18, 2015 by the Korean Intellectual Patent Office in related Application No. 10-2013-0152884.

* cited by examiner

MAGNETIC RESONANCE IMAGING APPARATUS AND CONTROL METHOD FOR RECONSTRUCTION OF UNDERSAMPLED DATA

CROSS-REFERENCE TO RELATED APPLICATION

This application claims priority from Korean Patent Application No. 10-2013-0152884, filed on Dec. 10, 2013 in the Korean Intellectual Property Office, the disclosure of which is incorporated herein by reference in its entirety.

BACKGROUND

1. Field

Apparatuses and methods consistent with exemplary embodiments relate to a magnetic resonance imaging (MRI) apparatus for medical imaging.

2. Description of the Related Art

The MRI apparatus applies a specific frequency and energy to atomic nuclei of a human body when a constant magnetic field is applied to the atomic nuclei, to cause the atomic nuclei to release energy, and converts the energy released from the atomic nuclei into signals so that a doctor can examine the organs, tissues, and structures inside the human body.

When a magnetic field is applied, protons configuring atomic nuclei are arranged in the direction of the magnetic field since themselves have spin angular momentum and magnetic dipole moment, and the atomic nuclei perform precession with respect to the direction of the magnetic field. The precession causes magnetic resonance so that an image of the inside human body can be acquired through the MRI.

Meanwhile, scanning by the MRI apparatus requires a time from 20 minutes to 1 hour or more according to an area to be scanned and a kind of MR images required. That is, the MRI apparatus requires a relatively long scanning time compared to other medical imaging modalities. The long scanning time is a disadvantage because it may inconvenience patients, and particularly, claustrophobic patients may not be able to endure MRI scanning. On the other hand, a reduced protocol may cause an incomplete images or images with poor quality.

Accordingly, apparatuses and methods are needed for reducing an MRI scanning time while improving the quality of images.

SUMMARY

Exemplary embodiments may overcome the above disadvantages and/or other disadvantages not described above. However, exemplary embodiments are not required to overcome the disadvantages described above, and may not overcome any of the problems described above.

One or more exemplary embodiments provide an MRI apparatus for reconstructing an image using random undersampled image data, a parallel imaging method, i.e., a parallel imaging technique, and compressed sensing, and a control method of the MRI apparatus.

In accordance with an aspect of an exemplary embodiment, an MRI apparatus includes: a receive coil assembly including a plurality of channels, and configured to receive an MR signal generated from an object; a data generator configured to generate undersampled image data on a k-space based on the MR signal; and a reconstruction processor configured to generate a first reconstructed image for the undersampled image data using a parallel imaging method, and to generate a second reconstructed image for the undersampled image data using compressed sensing.

The undersampled image data may include non-uniformly random undersampled image data.

The parallel imaging method may include at least one of Sensitivity Profiles From an Array of Coils for Encoding and Reconstruction in Parallel (SPACE RIP), Simultaneous acquisition of spatial harmonics (SMASH), Partially Parallel Imaging With Localized Sensitivities (PILS), and Generalized Autocalibrating Partially Parallel Acquisitions (GRAPPA).

The compressed sensing may use the first reconstructed image as an initial value for generating the second reconstructed image.

The compressed sensing may include dictionary learning compressed sensing.

The dictionary learning compressed sensing mat be expressed by:

$$\min_{x,D,Z} \sum_{i,j} \|R_{ij}x - Dz_{ij}\|_2^2 + \lambda\|F_u x - y\|_2^2 : \|z_{ij}\|_0 \leq T_0 \; \forall \; i, j,$$

where x represents the second reconstructed image, y represents an original k-space corresponding to the second reconstructed image, $R_{ij}$ represents a function for selecting a patch, $F_u$ represents fast Fourier transform (FFT), D represents dictionary acquired through k-singular value decomposition (k-SVD), $Z_{ij}$ represents a sparse coefficient acquired through orthogonal matching pursuit (OMP), II $II_2$ represents L2-norm, II $II_0$ represents L0-norm, $\lambda$ represents a weight of the L2-norm, and $T_0$ represents a degree of sparsity.

The dictionary learning compressed sensing may use global dictionary or adaptive dictionary.

The undersampling may use at least one of a Cartesian trajectory, a radial trajectory, and a spiral trajectory.

The data generator may generate a plurality of image data in correspondence to the plurality of channels.

The reconstruction processor may generate a plurality of first reconstructed images and a plurality of second reconstructed images in correspondence to the plurality of image data.

The combiner may combine the plurality of second reconstructed images into an image using a square sum or a complex sum, thereby generating a final reconstructed image.

In accordance with an aspect of an exemplary embodiment, a control method of an MRI apparatus, includes: at a receive coil assembly including a plurality of channels, receiving an MR signal generated from an object; generating undersampled image data on a k-space based on the MR signal; generating a first reconstructed image for the undersampled image data using a parallel imaging method; and generating a second reconstructed image for the undersampled image data using compressed sensing.

The generating of the undersampled image data may include generating non-uniformly random undersampled image data.

The generating of the first reconstructed image for the undersampled image data using the parallel imaging method may include generating the first reconstructed image using at least one of SPACE RIP, SMASH, PILS, and GRAPPA.

The generating of the second reconstructed image for the undersampled image data using the compressed sensing may include using the first reconstructed image as an initial value for generating the second reconstructed image.

The generating of the second reconstructed image for the undersampled image data using the compressed sensing may include generating the second reconstructed image using dictionary learning compressed sensing.

The generating of the second reconstructed image for the undersampled image data using the compressed sensing may include creating global dictionary or adaptive dictionary using a k-SVD.

The generating of the second reconstructed image for the undersampled image data using the compressed sensing may include acquiring a sparse coefficient using OMP, and performing patched reconstruction.

The generating of the second reconstructed image for the undersampled image data using the compressed sensing may include generating the second reconstructed image using the following equation:

$$\min_{x,D,Z} \sum_{i,j} \|R_{ij}x - Dz_{ij}\|_2^2 + \lambda\|F_u x - y\|_2^2 : \|z_{ij}\|_0 \le T_0 \ \forall \ i, j$$

where x represents the second reconstructed image, y represents an original k-space corresponding to the second reconstructed image, $R_{ij}$ represents a function for selecting a patch, $F_u$ represents FFT, D represents dictionary acquired through k-SVD, $Z_{ij}$ represents a sparse coefficient acquired through OMP, $\|\ \|_2$ represents L2-norm, $\|\ \|_0$ represents L0-norm, X represents a weight of the L2-norm, and $T_0$ represents a degree of sparsity.

The generating of the undersampled image data on the k-space based on the MR signal may include generating the undersampled image data using at least one of a Cartesian trajectory, a radial trajectory, and a spiral trajectory.

The generating of the undersampled image data on the k-space based on the MR signal may include generating a plurality of image data in correspondence to the plurality of channels.

The generating of the first reconstructed image may include generating a plurality of first reconstructed images in correspondence to the plurality of image data.

The generating of the second reconstructed image may include generating a plurality of second reconstructed images in correspondence to the plurality of image data.

The control method may further include combining the plurality of second reconstructed images into an image using a square sum or a complex sum, thereby generating a final reconstructed image.

According to the MRI apparatus and the control method thereof as described above, since image reconstruction is performed using random undersampled image data, a parallel imaging method, and compressed sensing, it is possible to increase a speed of image acquisition and to improve the quality of images.

BRIEF DESCRIPTION OF THE DRAWINGS

The above and/or other aspects will become more apparent by describing in detail certain exemplary embodiments, with reference to the accompanying drawings, in which.

DETAILED DESCRIPTION

Figure 1:
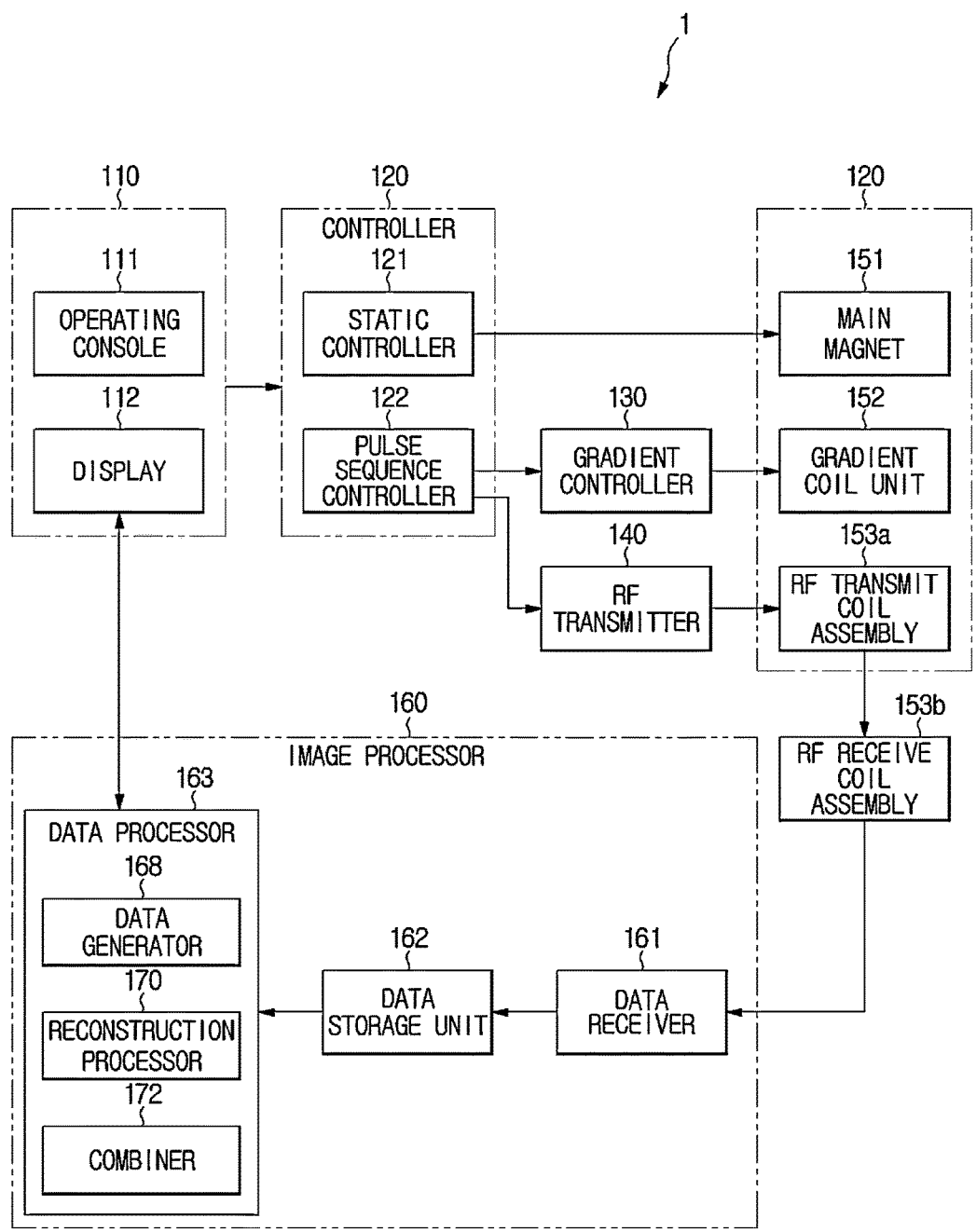
FIG. 1 is a control block diagram of an MRI apparatus according to an exemplary embodiment.

Certain exemplary embodiments are described in more detail below with reference to the accompanying drawings.

In the following description, same reference numerals are used for the same elements when they are depicted in different drawings. The matters defined in the description, such as detailed construction and elements, are provided to assist in a comprehensive understanding of the exemplary embodiments. However, the exemplary embodiments can be carried out without those specifically defined matters. Also, functions or elements known in the related art are not described in detail since they would obscure the exemplary embodiments with unnecessary detail.

FIG. 1 is a control block diagram of a MRI apparatus according to an exemplary embodiment.

Referring to FIG. 1, the MRI apparatus 1 may include a magnet assembly 150 for forming a magnetic field to cause resonance in atomic nuclei, a controller 120 for controlling the operation of the magnet assembly 150, and an image processor 160 for receiving an echo signal (that is, an MR signal) generated from the atomic nuclei to create an MR image.

The magnet assembly 150 may include a main magnet 151 for forming a static magnetic field, a gradient coil unit 152 for forming a magnetic field gradient in the static magnetic field, and an RF transmit coil assembly 153a for transmitting an RF pulse to excite atomic nuclei. Separately from the magnet assembly 150, an RF receive coil assembly 153b for receiving an echo signal may be provided.

Figure 2A:
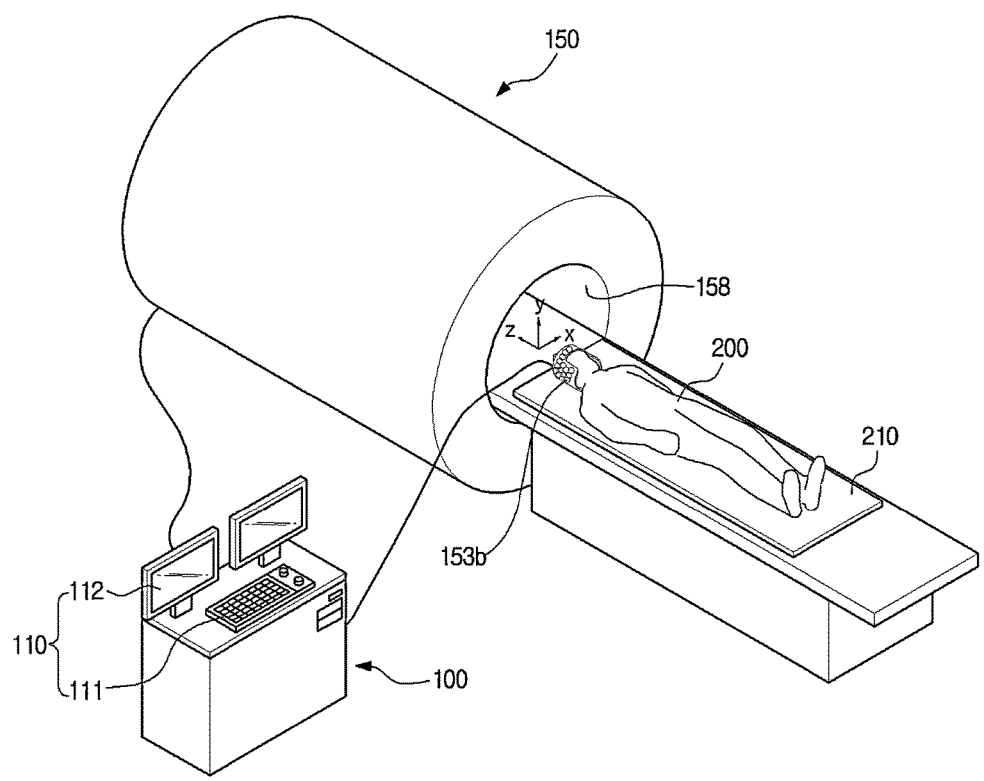
FIG. 2A shows an example of an MRI apparatus having a radio frequency (RF) receive coil assembly.

Referring to FIG. 2A, when an object 200 is positioned in the bore 158 of the magnet assembly 150, a static magnetic field and a gradient magnetic field may be formed. Further, an RF pulse may be transmitted to the RF transmit coil assembly 153a to excite atomic nuclei of the object 200, an echo signal may be generated from the excited atomic nuclei, and the echo signal may be received by the RF receive coil assembly 153b.

For convenience of description, the object 200 is assumed to be a human; however, the object may be an animal.

The controller 120 may include a static controller 121 for controlling the strength and direction of a static magnetic field that is formed by the main magnet 151, and a pulse sequence controller 122 for generating pulse sequences and controlling the gradient coil unit 152 and the RF transmitter 140 according to the pulse sequences.

A gradient controller 130 applies a gradient signal to the gradient coil unit 152, and a RF transmitter 140 applies an RF signal to the RF transmit coil assembly 153a.

The RF transmitter 140 may apply a high-frequency signal to the RF transmit coil assembly 153a according to a control signal received from the pulse sequence controller 122 so that the RF transmit coil assembly 153a transmits the RF pulse to the bore of the magnet assembly 150.

The RF transmitter 140 may include a modulation circuit for modulating a high frequency output signal to a pulse type signal, and a RF power amplifier for amplifying the pulse type signal.

The RF transmit coil assembly 153a may transmit the RF pulse to excite atomic nuclei, and the separate RF receive coil assembly 153b may receive an MR signal from the bore.

The RF receive coil assembly 153b may be connected to the image processor 160, which may include a data receiver 161 for receiving data regarding an MR signal generated from a spin echo signal, that is, atomic nuclei, a data storage unit 162 for storing data collected by the data receiver 161, and a data processor 163 for processing the stored data to create an MR image.

The data receiver 161 may include a preamplifier for amplifying the MR signal received by the RF receive coil assembly 153b, a phase detector for receiving the MR signal from the preamplifier to detect a phase of the MR signal, and an analog-to-digital (A/D) converter for converting an analog signal acquired by phase detector into a digital signal. The data receiver 161 may transmit the digitalized MR signal to the data storage unit 162.

In the data storage unit 162, a data space configuring a two-dimensional (2D) Fourier space may be formed, and after scanned data is all stored in the data storage unit 162, the data processor 163 may perform 2D inverse FFT (IFFT) on data in the 2D Fourier space to reconstruct an image of the object 200. The reconstructed image may be displayed on the display 112.

The MRI apparatus 1 may include a user operating station 110 to receive control commands regarding operations of the MRI apparatus 1 from a user, and particularly, the user operating station 110 may receive a command regarding a scan sequence from a user to create a pulse sequence according to the command.

The user operating station 110 may include an operating console 111 for allowing a user to manipulate the MRI apparatus 1, and the display 112 for displaying a control state and displaying an image created by the image processor 160.

Figure 2B:
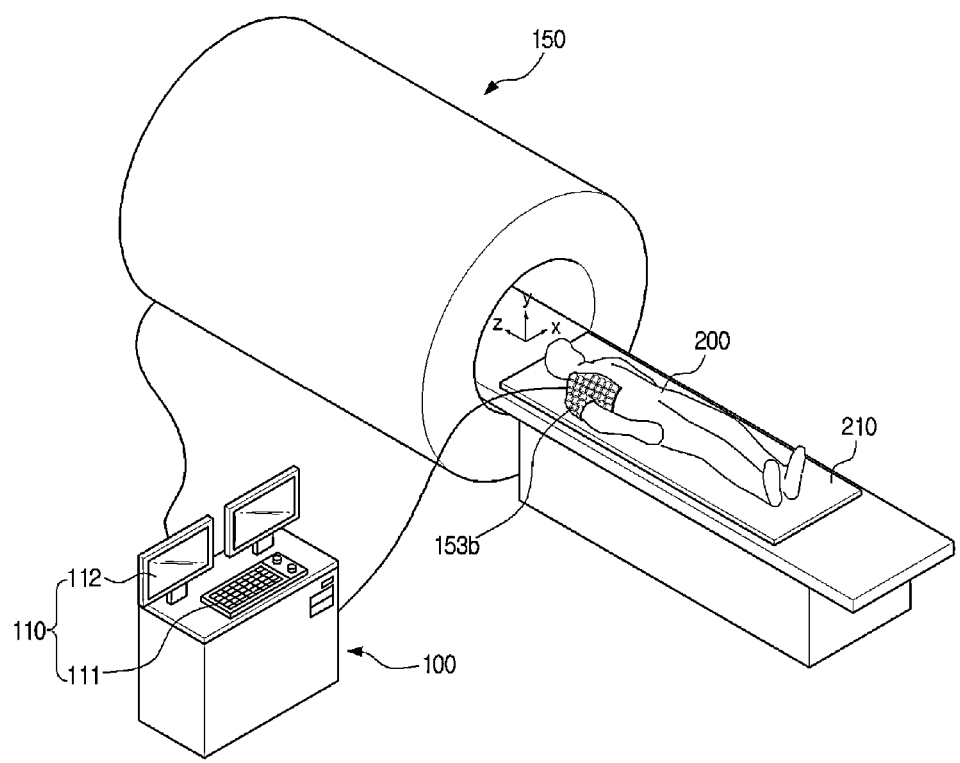
FIG. 2B shows another example of an MRI apparatus having an RF receive coil assembly.

FIGS. 2A and 2B show examples of an MRI apparatus having an RF receive coil assembly.

As shown in FIGS. 2A and 2B, the RF receive coil assembly 153b may be separated from the magnet assembly 150, and may include one or more RF receive coils which may be worn on a body portion of the object 200, for example, on a head, neck, shoulder, wrist, etc. The RF receive coils of the RF receive coil assembly 153b may include a head coil, a neck coil, a shoulder coil, and a wrist coil, etc., and the RF receive coil assembly 153b may be designed to correspond to a shape of a body part on which the RF receive coils are worn.

More specifically, a head coil, as shown in FIG. 2A, may be designed in the shape of a helmet to scan the head of the object 200. A shoulder coil, as shown in FIG. 2B, may be designed in the shape of a chest protector to scan the shoulder and chest of the object 200.

Further, the RF receive coil assembly 153b may include a surface coil. The surface coil has a smaller size than a volume coil, and is in the shape of a 2D layer, and, thus, the surface coil has a substantially high signal-to-noise ratio (SNR) with respect to an area to which the surface coil is adjacent.

The RF receive coil 153b may include an array coil in which several surface coils are one-dimensionally or two-dimensionally arranged in an array to widen a receive area. The array coil may be designed to a shape corresponding to a part to be scanned, and may be an array coil for head, an array coil for head and/or neck, an array coil for chest, an array coil for spine, an array coil for abdomen, and/or an array coil for leg. Since individual surface coils forming an array coil have different relative positions, signals that are received by the respective surface coils may have different phases. Accordingly, if receive phases of the surface coils are considered when an image is reconstructed by synthesizing signals received by the respective surface coils, an image having a high SNR may be acquired.

The RF receive coil assembly 153b may include a multichannel coil in order to use a parallel imaging method, as described in greater detail below.

The object 200 wears the RF receive coil on a body part, and is positioned on a transfer unit 210 for scanning by the MRI apparatus 1. The controller 120, the gradient controller 130, the RF transmitter 140, and the image processor 160 may be arranged in an enclosure 100. In one side of the enclosure 100, at least one cable for transmitting and receiving signals to and from the magnet assembly 150 and the RF receive coil assembly 153b may be provided. Also, the user operating station 110 may be, mounted on the upper part of the enclosure 100, as shown in FIGS. 2A and 2B.

Figure 3:
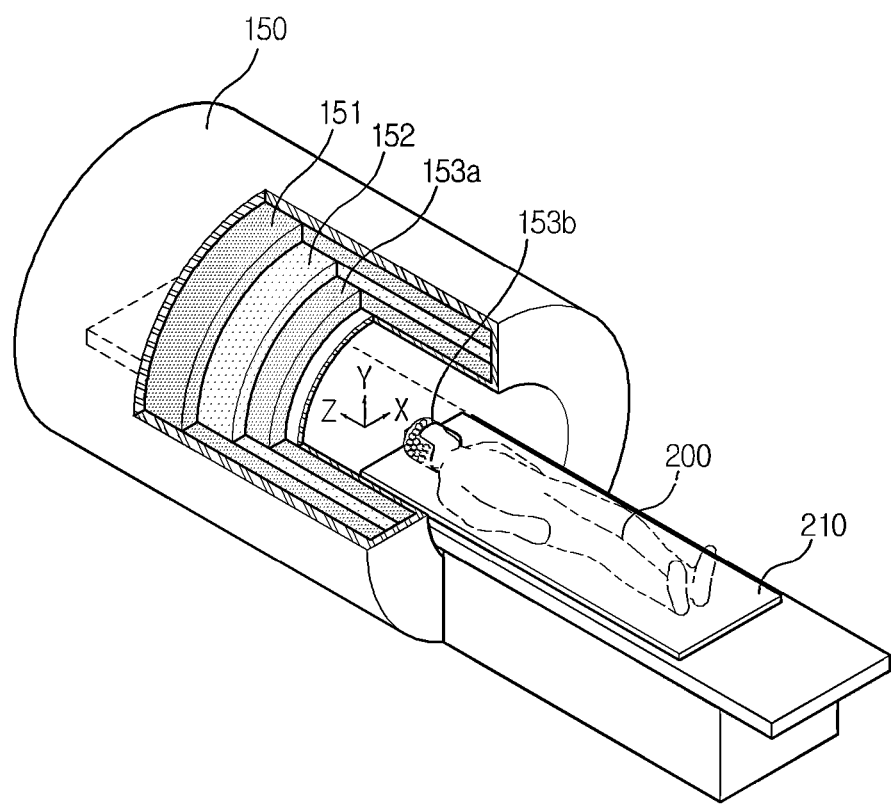
FIG. 3 shows a structure of a magnet assembly.

Referring to FIG. 3, the magnet assembly 150 may be in the shape of a hollow cylinder, i.e., a gantry, having a bore formed in the inside space of the magnet assembly 150. The transfer unit 210 may move the object 200 to the bore, to perform the MRI.

The magnet assembly 150 may include, as described above, the main magnet 151, the gradient coil unit 152, and the RF transmit coil assembly 153a.

The main magnet 151 may have a structure in which coils are wound around the bore, and if a current is applied to the main magnet 151, a static magnetic field is formed inside the magnet assembly 150, that is, in the bore. The direction of the static magnetic field may be parallel to the concentric axis of the magnet assembly 150.

If the static magnetic field is formed in the bore, the atomic nuclei of atoms (specifically, hydrogen atoms) configuring the object 200 may be arranged in the direction of the static magnetic field, and perform precession with respect to the direction of the static magnetic field. The precession speed of the atomic nuclei may be expressed as a precession frequency, i.e., a Larmor frequency, and may be represented by following equation (1):

$$\omega = \gamma B_0, \quad (1)$$

where $\omega$ is the Larmor frequency, $\gamma$ is a proportional constant, and $B_0$ is the strength of an external magnetic field.

The proportional constant depends on the kind of atomic nuclei, the strength of the external magnetic field is measured in units of Tesla (T) or Gauss (G), and the precession frequency is measured in units of Hz.

For example, hydrogen protons have a precession frequency of 42.58 MHz in an external magnetic field of 1 T. Since hydrogen atoms constitute a main portion of atoms of the human body, the MRI apparatus 1 may acquire an MR signal using the precession of hydrogen protons.

The gradient coil unit 152 may generate a gradient in the static magnetic field formed in the bore.

Figure 4:
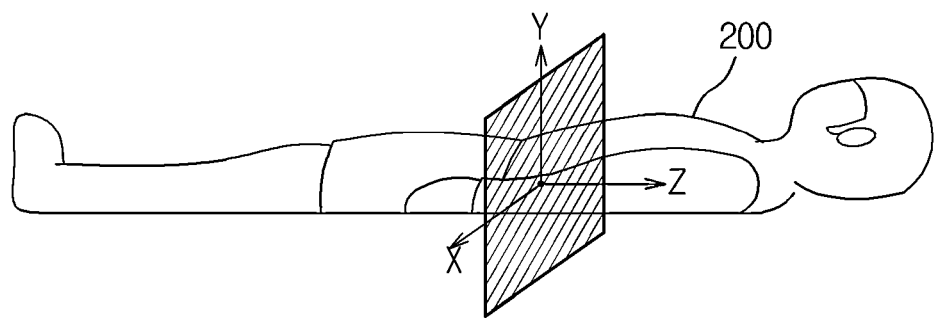
FIG. 4 shows an object in a space divided to x, y, and z axes.

As shown in FIG. 4, an axis parallel to a direction from head to feet of the object 200 is parallel to the direction of the static magnetic field may be a z-axis, an axis parallel to the left and right direction of the object 200 may be an x-axis, and an axis parallel to the up and down direction of the bore 158 may be a y-axis.

In order to acquire three-dimensional (3D) spatial information of magnetic resonance signals, magnetic field gradients with respect to all of the x-, y-, and z-axes are required. Accordingly, the gradient coil unit 152 includes three pairs of gradient coils.

Figure 5:
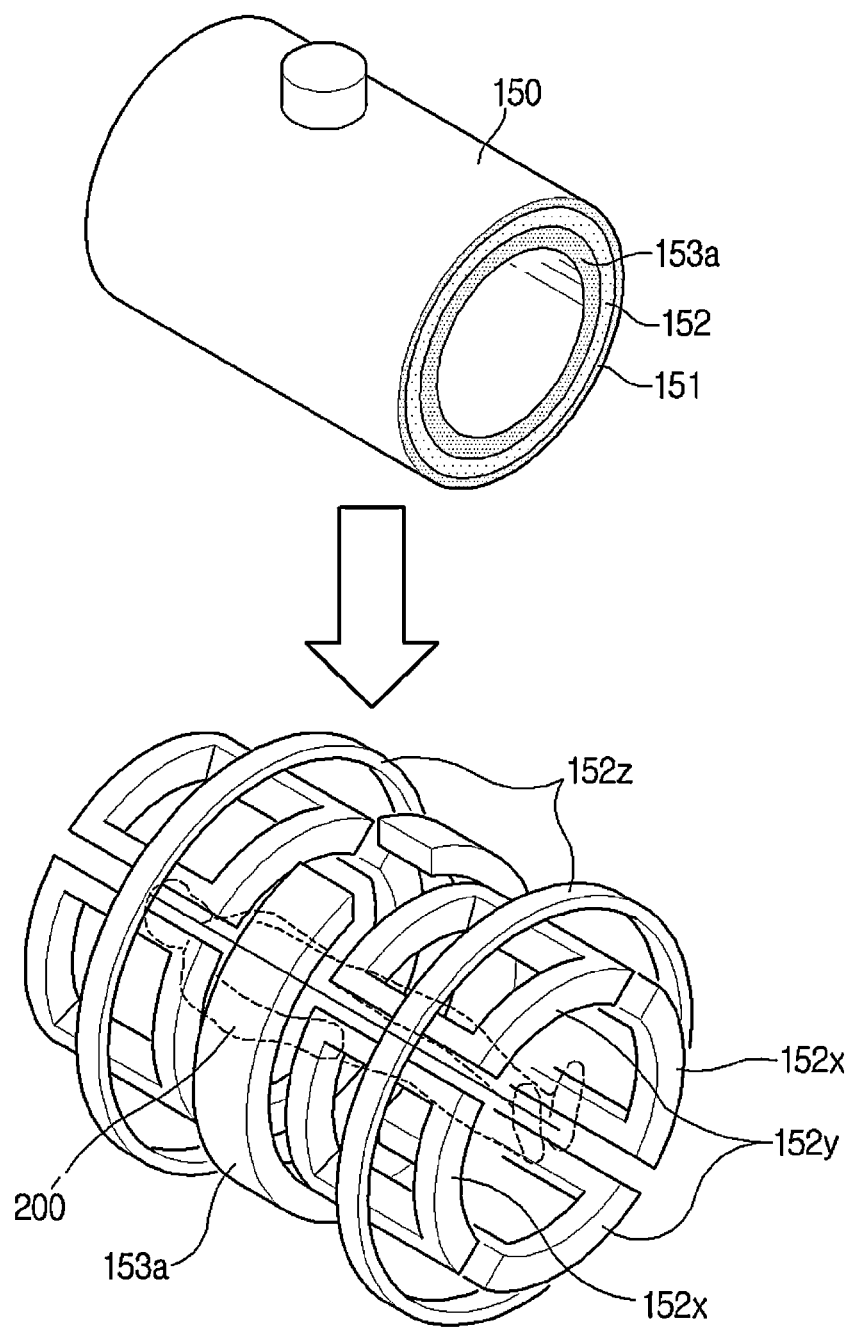
FIG. 5 shows structures of a magnet assembly and a gradient coil unit.

As shown in FIG. 5, z-axis gradient coils 152z include a pair of ring-shaped coils, y-axis gradient coils 152y are positioned above and below the object 200, and x-axis gradient coils 152x are positioned in the left and right sides of the object 200.

Figure 6:
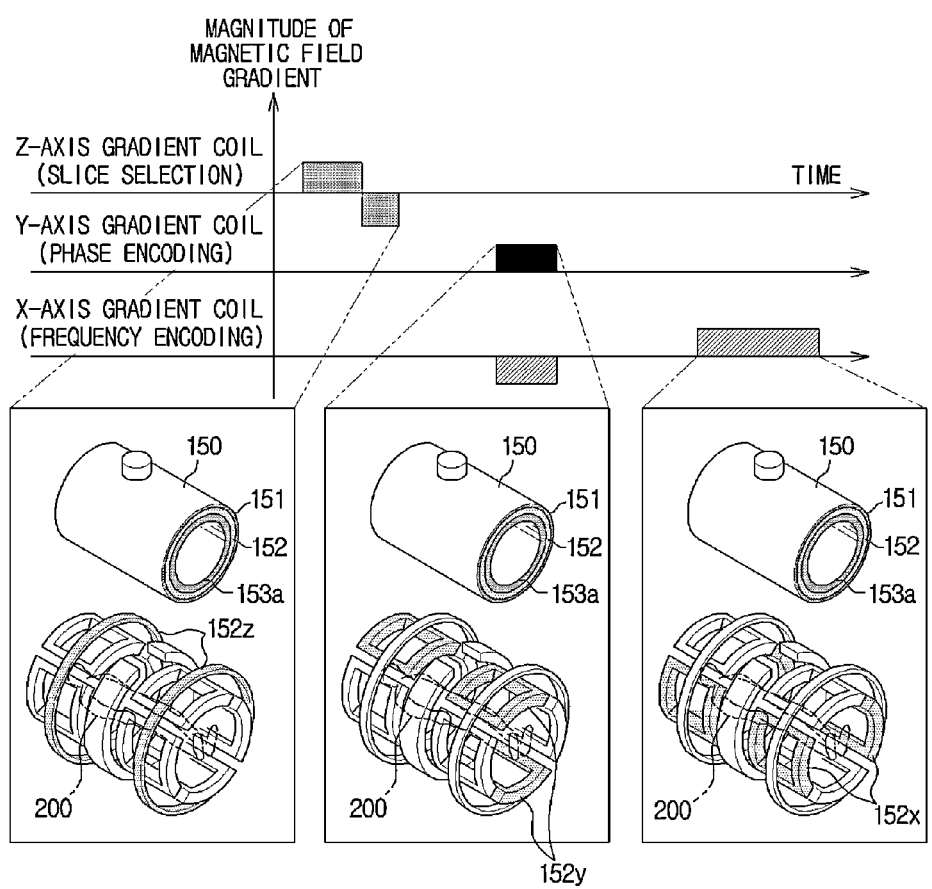
FIG. 6 shows individual gradient coils configuring the gradient coil unit and pulse sequences related to operations of the individual gradient coils.

FIG. 6 shows individual gradient coils configuring the gradient coil unit 152 and pulse sequences related to operations of the individual gradient coils.

If direct currents having opposite polarities flow through the respective z-axis gradient coils 152z in opposite directions, a change of a magnetic field in the z-axis direction occurs so that a gradient field is formed.

If a gradient magnetic field is formed by flowing current through the z-axis gradient coils 152z for a predetermined time period, a resonance frequency changes according to the magnitude of the gradient magnetic field. Then, if a high-frequency signal corresponding to a specific area is applied through the RF transmit coil assembly 153a, only protons of a section corresponding to the specific area cause resonance. That is, the z-axis gradient coils 152z are used to select a slice. The greater gradient of the gradient magnetic field formed by the z-axis direction enables the thinner slice to be selected.

If a slice is selected through the gradient magnetic field formed by the z-axis gradient coils 152z, spins configuring the corresponding slice have the same frequency and phase, so that the individual spins cannot be distinguished from each other.

In this state, if a gradient magnetic field in the y-axis direction is formed by the y-axis gradient coils 152y, the y-axis gradient field causes phase shift such that the rows of the slice have different phases.

That is, if the y-axis gradient magnetic field is formed, the phases of the spins of rows to which the greater gradient field has been applied change to the higher frequencies, and the phases of the spins of rows to which the smaller gradient field has been applied change to the lower frequencies. Thereafter, if the y-axis gradient field disappears, phase shift occurs in the individual rows of the selected slice so as for the rows to have different phases, so that the rows can be distinguished from each other. As such, the gradient magnetic field formed by the y-axis gradient coils 152y is used for phase encoding. However, spins configuring each row still cannot be distinguished since they have the same frequency and phase.

In this state, if a gradient magnetic field in the x-axis direction is formed by the x-axis gradient coils 152x, the x-axis gradient magnetic field causes spins configuring each row to have different frequencies such that the spins can be distinguished from each other. As such, the gradient magnetic field formed by the x-axis gradient coils 152x is used for frequency encoding.

As described above, the gradient fields respectively formed by the z-, y-, and x-axis gradient coils spatially encode the spatial locations of individual spins through slice selection, phase encoding, and frequency encoding.

The gradient coil unit 152 may be connected to the gradient controller 130 which may apply a driving signal to the gradient coil unit 152 according to a control signal received from the pulse sequence controller 122 to generate gradient magnetic fields. The gradient controller 130 may include three driving circuits in correspondence to three pairs of gradient coils 152z, 152y, and 152x.

As described above, atomic nuclei arranged by an external magnetic field perform precession at the Larmor frequency, and a sum of magnetization vectors of some atomic nuclei may be represented as net magnetization M.

The z-axis component of the net magnetization M cannot be measured, and only $M_{xy}$ can be detected. Accordingly, in order to obtain an MR signal, the atomic nuclei should be excited so that net magnetization exists on the xy plane. For excitation of atomic nuclei, it is necessary to apply a RF pulse tuned to the Larmor frequency of the atomic nuclei to the static magnetic field.

In a spin echo pulse sequence method, the RF transmit coil assembly 153a sequentially applies two RF pulses with a predetermined time interval Δt, strong transverse magnetization occurs in atomic nuclei when the time interval Δt has again elapsed, and an MR signal may be acquired through the strong transverse magnetization. This method is called a spin echo pulse sequence. A time period taken until the MR signal is generated from when the first RF pulse has been applied is time echo (TE).

A degree at which protons have been flipped may be represented as an angle at which the protons have moved away from an axis on which they have been positioned before flipped, and the corresponding RF pulse may be represented as a 90° RF pulse, a 180° RF pulse, etc., according to the degree of flip.

Figure 7:
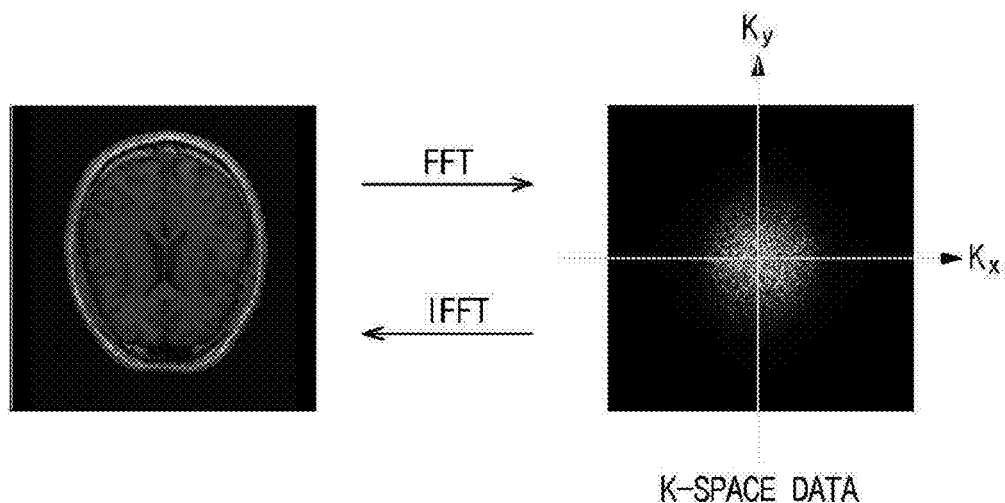
FIG. 7 is a view for describing a method of acquiring a magnetic resonance image.

FIG. 7 is a view for describing a method of acquiring an MR image.

If a strong magnetic field is applied to an object, magnetic hydrogen atoms are aligned according to the magnetic field. An RF pulse is applied to the aligned hydrogen atoms to excite the hydrogen atoms, and an MR signal, that is, an echo signal generated when the hydrogen atoms return to their original states, is detected by the RF receive coil assembly 153b. The echo signal may be represented as data on a k-space, i.e., image data, in the data receiver 161.

As shown in FIG. 7, an RF pulse may be applied to an image so that the image is converted into image data, and the image data may be acquired by 2D FFT according to equation (2).

$$F(k_x,k_y)=\iint f(x,y)e^{-j(2\pi k_x x+2\pi k_y y)}dxdy, \qquad (2)$$

where f(x, y) represents an image, and
$F(k_x,k_y)$ represents image data.

Data acquisition on the $k_x$ axis is frequency encoding, and data acquisition on the $k_y$ axis is phase encoding. The acquired image data may be stored in the data storage unit 162.

Conversely, IFFT is performed on the image data stored in the data storage unit 162, thereby acquiring an MR image, i.e., a reconstructed image, as shown in the left side of FIG. 7.

An area to which a weak self-phase encoding magnetic field has been applied is represented by a signal having a great amplitude, wherein the signal is filled in the center part of the k-space and has contrast information of tissue. An area to which a strong phase encoding magnetic field has been applied is represented by a signal having weak intensity due to dephasing, wherein the signal is filled in the edge part of the k-space, and shows details or borders between tissues in the corresponding image.

In order to reduce time that is taken to acquire image data, the MRI apparatus 1 may perform sampling, and the RF transmit coil assembly 153a may transmit a RF pulse corresponding to sampled image data. For example, sampling by a parallel imaging method may be used, and specifically, random undersampling may be used, as described in detail below with reference to FIGS. 8, 9, and 10.

Figure 8:
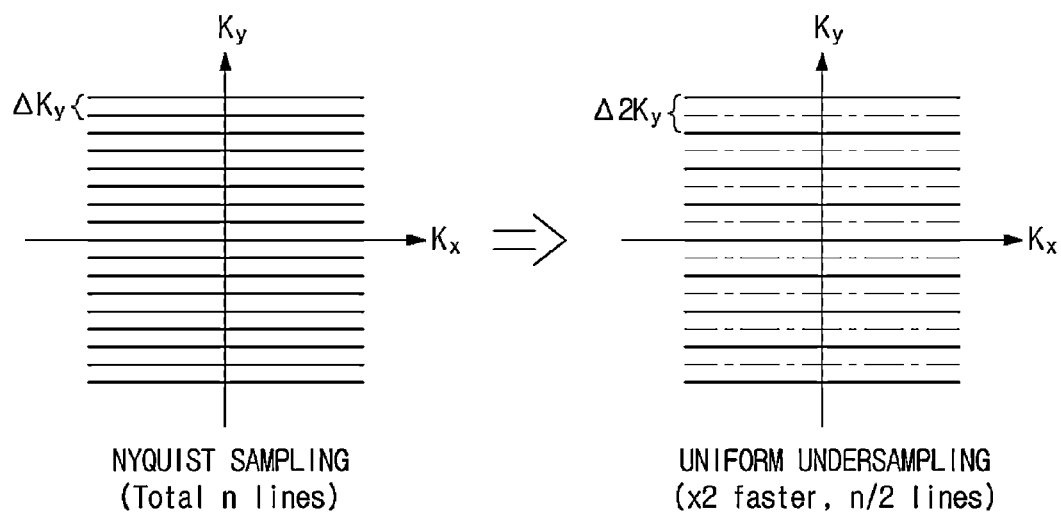
FIG. 8 is a view for describing sampling of a parallel imaging method.
Figure 9:
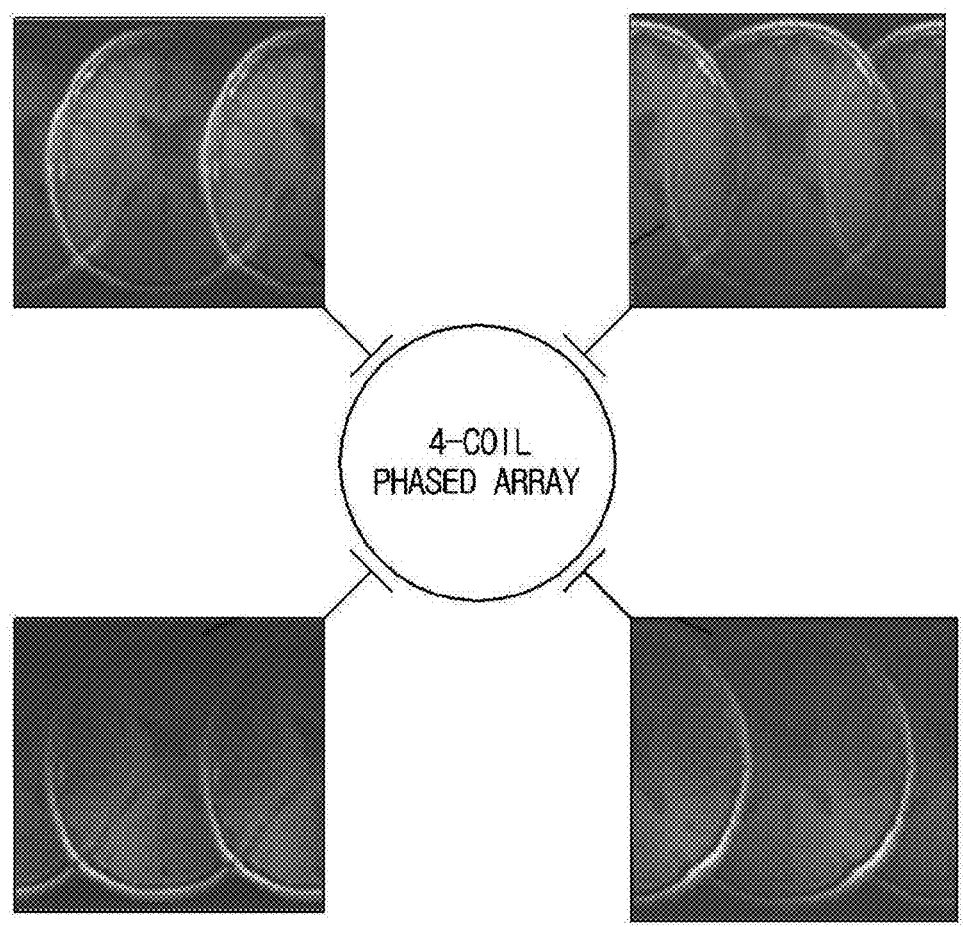
FIG. 9 is a view for describing an example of an RF receive coil assembly for acquiring undersampled image data.
Figure 10:
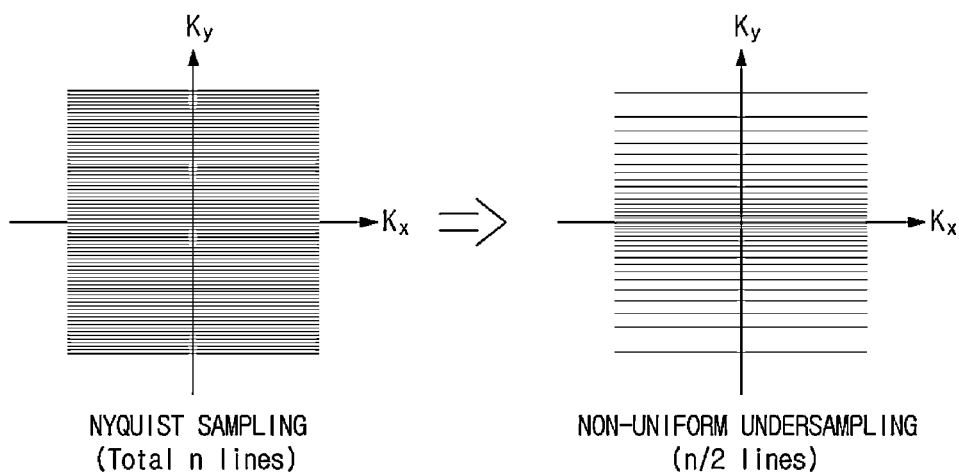
FIG. 10 is a view for describing non-uniformly random undersampling in the sampling of the parallel imaging method.

In FIGS. 8, 9, and 10, for convenience of description, sampling is performed on a Cartesian trajectory, however, sampling may be performed on a non-Cartesian trajectory, such as a radial trajectory and/or a spiral trajectory.

FIG. 8 is a view for describing sampling of a parallel imaging method, for example, a sensitivity encoding (SENSE).

The left side of FIG. 8 corresponds to sampling with respect to an entire k-space at a Nyquist rate to acquire image data. Herein, the Nyquist rate represents a minimum sampling frequency for reconstructing an original signal when the original signal can be reconstructed by sampling it at a sampling frequency which is two times or more of the frequency bandwidth of the original signal.

The right side of FIG. 8 corresponds to a case of acquiring image data by sampling the entire k-space at the Nyquist rate or less, that is, by undersampling, in a parallel imaging method. In other words, image data is acquired at an interval that is two times wider than the Nyquist sampling interval. Thereby, a time at which image data is acquired becomes two times faster than when the image data is sampled at the Nyquist rate, which is called a reduction factor (=2). The right side of FIG. 8 corresponds to a case of acquiring image data two times faster than the case corresponding to the left side of FIG. 8. Thus, an acquisition time of image data may be reduced depending times the image data is acquired, i.e., at a greater interval than the Nyquist sampling interval.

In order to perform undersampling as shown in the right side of FIG. 8, the RF receive coil assembly 153b may include a multi-channel coil such as a phased array coil.

FIG. 9 is a view for describing an example of an RF receive coil assembly for acquiring undersampled image data.

Referring to FIG. 9, the RF receive coil assembly 153b may be configured with a phased array coil having four channels. If undersampled image data as shown in the right side of FIG. 8 is acquired through the RF receive coil assembly 153b by a data generator 168, IFFT may be performed on the undersampled image data to generate reconstructed images including partially overlapping tissues, as shown in FIG. 9. In other words, artifact reconstructed images may be acquired by the number of channels.

Each channel has its unique characteristics regarding an image area having higher intensity than the remaining area. In the example of FIG. 9 showing an RF receive coil assembly having four channels, the respective channels have higher intensities in a upper left area, in a upper right area, in a lower left area, and in a lower right area, respectively. More specifically, an image reconstructed in correspondence to a upper left channel (a first channel) shows higher intensity in the upper left area than the remaining area, an image reconstructed in correspondence to a upper right channel (a second channel) shows higher intensity in the upper right area than the remaining area, an image reconstructed in correspondence to a lower left channel (a third channel) shows higher intensity in the lower left area than the remaining area, and an image reconstructed in correspondence to a lower right channel (a fourth channel) shows higher intensity in the lower right area than the remaining area.

In order to remove artifact while maintaining the unique characteristics of each channel, non-uniform random undersampling in the parallel imaging method, as shown in FIG. 10, may be used.

The left side of FIG. 10 corresponds to a case of acquiring image data by sampling the entire k-space at the Nyquist rate, as the left side of FIG. 8.

The right side of FIG. 10 corresponds to a case of acquiring image data by sampling the entire k-space at the Nyquist rate or less, that is, by undersampling the entire k-space. For example, image data is randomly extracted regardless of a sampling interval, and an area, for example, the center area of the k-space, having a large amount of image information is sampled with high sampling density. In other words, a sampling rate increases at a lower frequency area in the center area of the k-space, and decreases at higher spatial frequency area in the edge areas of the k-space.

If random undersampled image data as shown in the right side of FIG. 10 is acquired through four channels the RF receive coil assembly 153b, a reconstructed image generated by performing IFFT on the random undersampled image data becomes an image from which artifact has been removed.

Accordingly, a reconstruction processor 170 may perform image reconstruction, i.e., a first reconstruction process, based on the random undersampled image data as shown in the right side of FIG. 10 and generate one or more first reconstructed images in correspondence to the number of receive coils, i.e., channels. The image reconstruction may be performed by a parallel imaging method, such as SPACE RIP, SMASH, PILS, and/or GRAPPA, which are known to those skilled in the art.

For example, in an exemplary embodiment, the image reconstruction may be performed by GRAPPA. GRAPPA corrects undersampled image data to image data sampled at the Nyquist rate. In other words, if the number of lines of image data sampled at the Nyquist rate is n and the number of lines of undersampled image data is n/2, GRAPPA creates the non-sampled remaining n/2 lines from the n/2 lines of the undersampled image data. For example, if first, third, and fourth lines of undersampled image data acquired by the first channel have been sampled, but a second line of the undersampled image data has been not sampled, the first and third lines located closest to the second line are linearly combined to estimate the second line. In this way, GRAPPA estimates the non-sampled remaining n/2 lines from a linear combination of neighboring lines to thereby correct undersampled image data to image data sampled at the Nyquist rate. That is, image data having a complete k-space shape is calculated for each channel.

The GRAPPA performs IFFT on image data having a complete k-space shape for each channel to generate a reconstructed image. Reconstructed images generated in correspondence to the number of channels are first reconstructed images.

A reconstruction processor 170 may perform image reconstruction again, in a second reconstruction process, using the first reconstructed images as initial values. More specifically, the reconstruction processor 170 may perform image reconstruction again on the individual first reconstructed images to generate a plurality of second reconstructed images.

Compressed sensing may be applied to generate the second reconstructed images, and more specifically, dictionary learning compressed sensing using predetermined dictionary may be applied to generate the second reconstructed images.

The dictionary learning compressed sensing is as follows. First, global dictionary or adaptive dictionary is created using k-SVD. Then, a sparse coefficient is acquired using OMP, and patched reconstruction is performed. Images that satisfy a predetermined convergent condition when patched reconstruction is repeatedly performed are provided as second reconstructed images. The dictionary learning compressed sensing may be expressed by following equation (3):

$$\min_{x,D,Z} \sum_{i,j} \|R_{ij}x - Dz_{ij}\|_2^2 + \lambda\|F_u x - y\|_2^2 : \|z_{ij}\|_0 \leq T_0 \ \forall \ i, j \quad (1)$$

Figure 11:
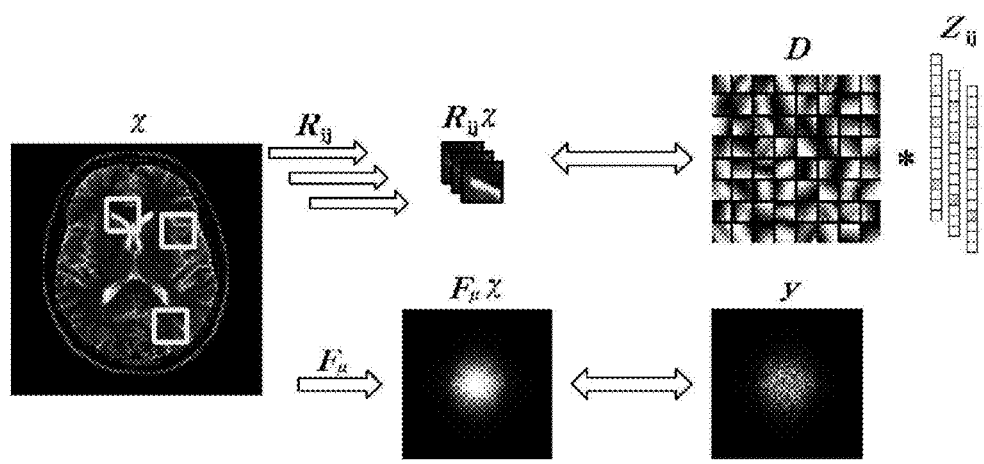
FIG. 11 is a view for describing dictionary learning compressed sensing.

FIG. 11 is a view for describing dictionary learning compressed sensing.

Referring to FIG. 11 and equation (3), x represents each of a plurality of second reconstructed images, y represents an original k-space corresponding to the second reconstructed image, $R_{ij}$ represents a function for selecting a patch, $F_u$ represents FFT, D represents dictionary acquired through k-SVD, $Z_{ij}$ represents a sparse coefficient acquired through OMP, II $II_2$ represents L2-norm, and II $II_0$ represents L0-norm. However, unlike equation (3), II $II_0$ may be a L1-norm. Further, λ represents a weight of the L2-norm, and $T_0$ represents a degree of sparsity.

$T_0$ may be set to a predetermined value and stored in the data storage unit 162, or $T_0$ may be received from a user through an operating console.

If λ is too small, high-resolution information is weakened in each of the plurality of second reconstructed images. Meanwhile, if λ is too great, noise increases in each of the plurality of second reconstructed images. That is, the first and second terms of equation (3) are used to adjust noise reduction and to adjust loss prevention of high-resolution information, respectively, although they perform image reconstruction together.

Since the dictionary learning compressed sensing expressed by Equation (3) uses each of the plurality of first reconstructed images as an initial value, a time that is taken to satisfy a convergent condition can be reduced.

After the plurality of second reconstructed images corresponding to the number of channels are acquired using the dictionary learning compressed sensing, the combiner 174 may combine the plurality of second reconstructed images into a reconstructed image using a square sum or a complex sum. The combined reconstructed image is a final reconstructed image, and the final reconstructed image may be output to the display 112 so that a user can view the final reconstructed image.

Figure 12:
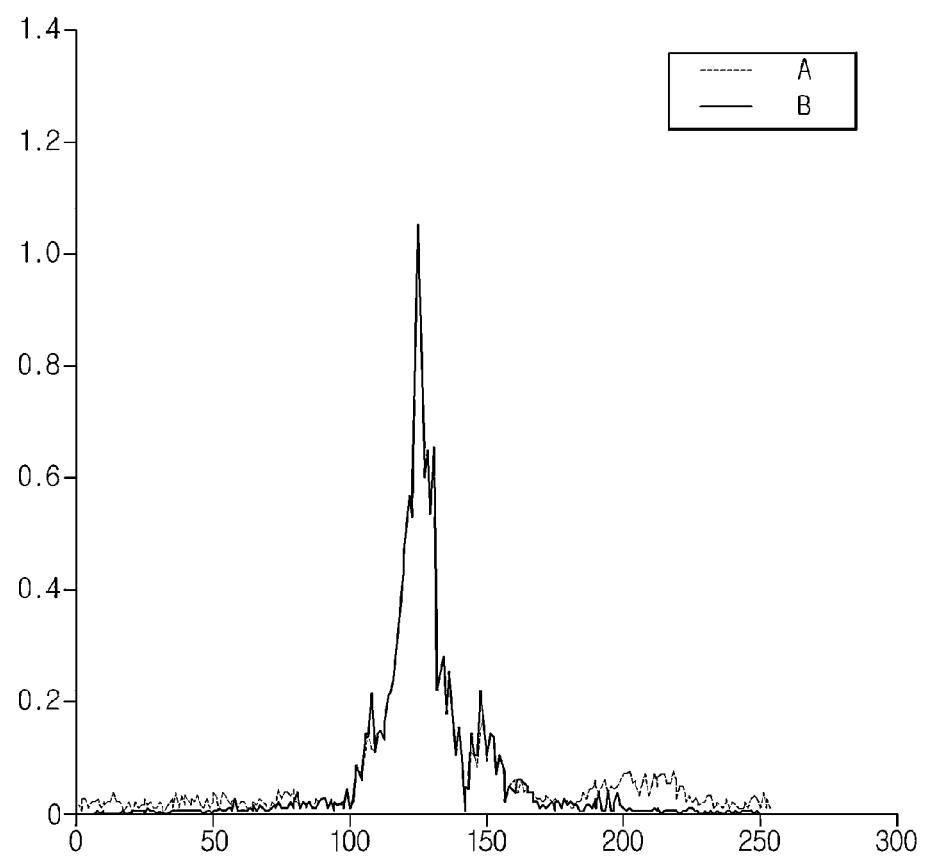
FIG. 12 shows an original k-space and a k-space of a final reconstructed image.

FIGS. 12 and 13 are views related to a final reconstructed image generated by the MRI apparatus 1. FIG. 12 shows an original k-space and a k-space of a final reconstructed image. FIG. 12 shows sections of k-spaces in a $k_x$ direction based on a center point, wherein A is a graph showing a section of the original k-space, and B is a graph showing a section of the k-space of the final reconstructed image. As shown in FIG. 12, the B graph is nearly identical to the A graph. Accordingly, it was verified that the image quality of the final reconstructed image was maximized, although an initial image data was undersampled.

Figure 13A:
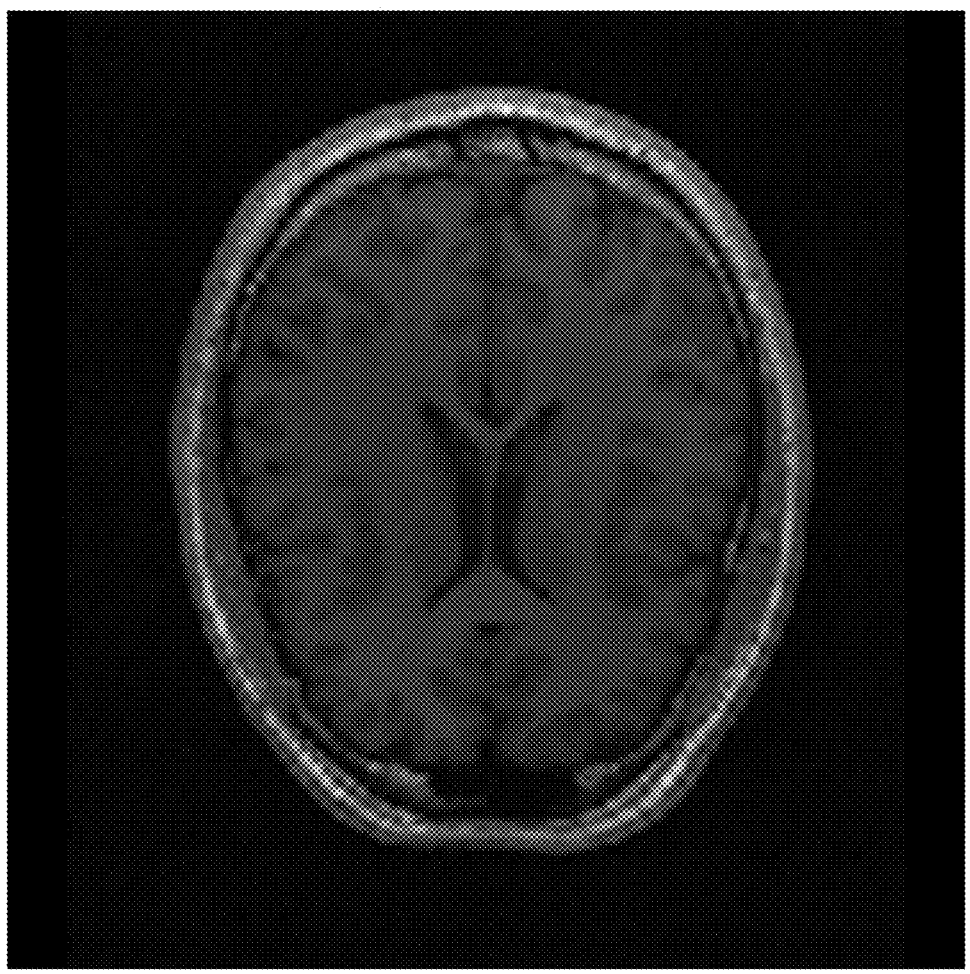
FIGS. 13A, 13B, and 13C show second reconstructed images generated by a MRI apparatus.
Figure 13B:
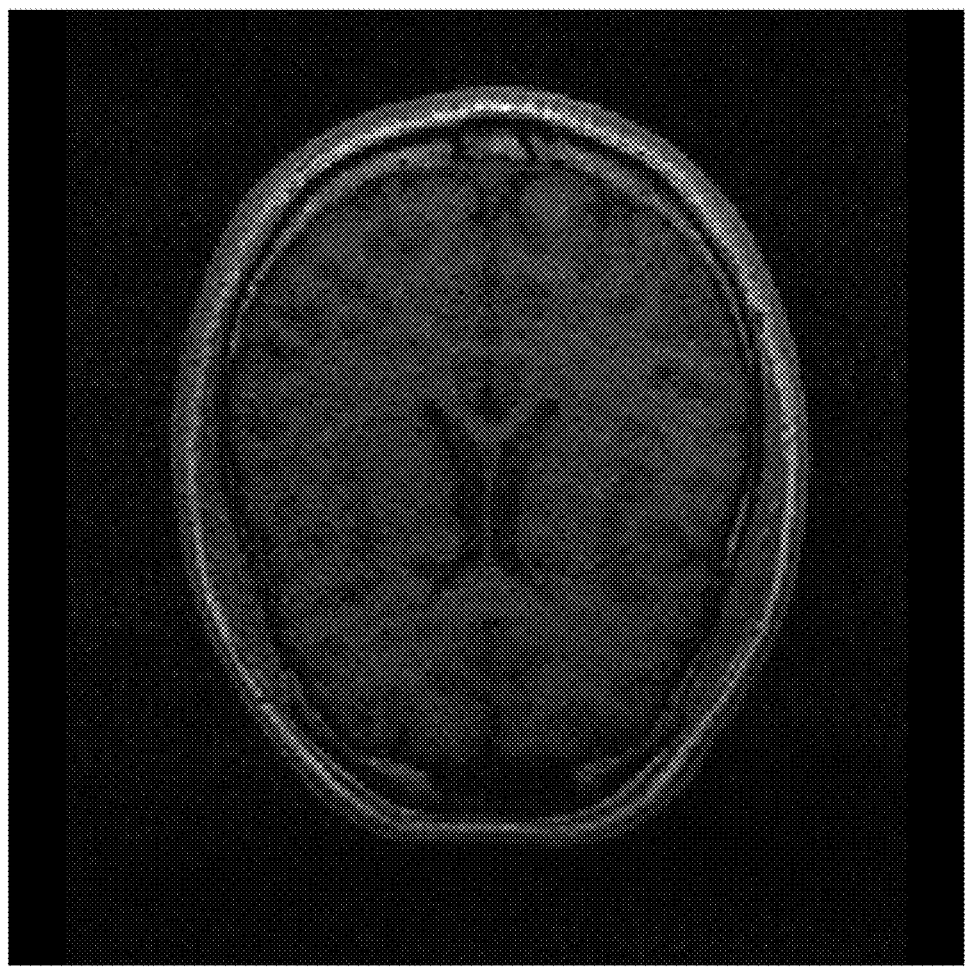
Figure 13C:
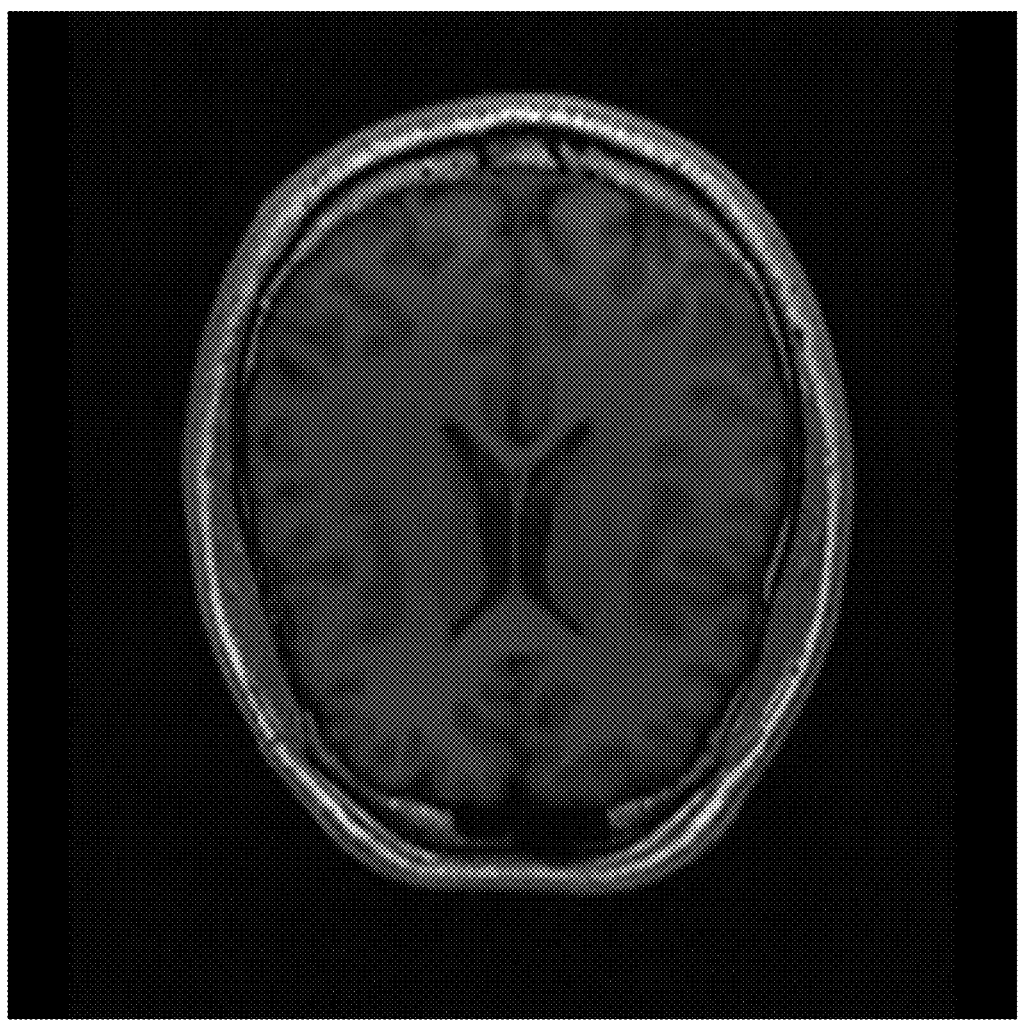

FIG. 13A shows an image (that is, a target image) obtained by performing IFFT on a complete k-space for each channel and combining the results into an image. FIG. 13B shows an image obtained by generating a plurality of first reconstructed images using GRAPPA and combining the plurality of first reconstructed images into an image. FIG. 13C shows an image (that is, a final reconstructed image) obtained by applying dictionary learning compressed sensing to the first reconstructed images to generate a plurality of second reconstructed images, and combining the second reconstructed images into an image.

As seen from FIG. 13B, the image includes a lot of noise, whereas the image (that is, the final reconstructed image) of FIG. 13C includes little noise so that the image quality is nearly the same as that of the target image of FIG. 13A.

Figure 14:
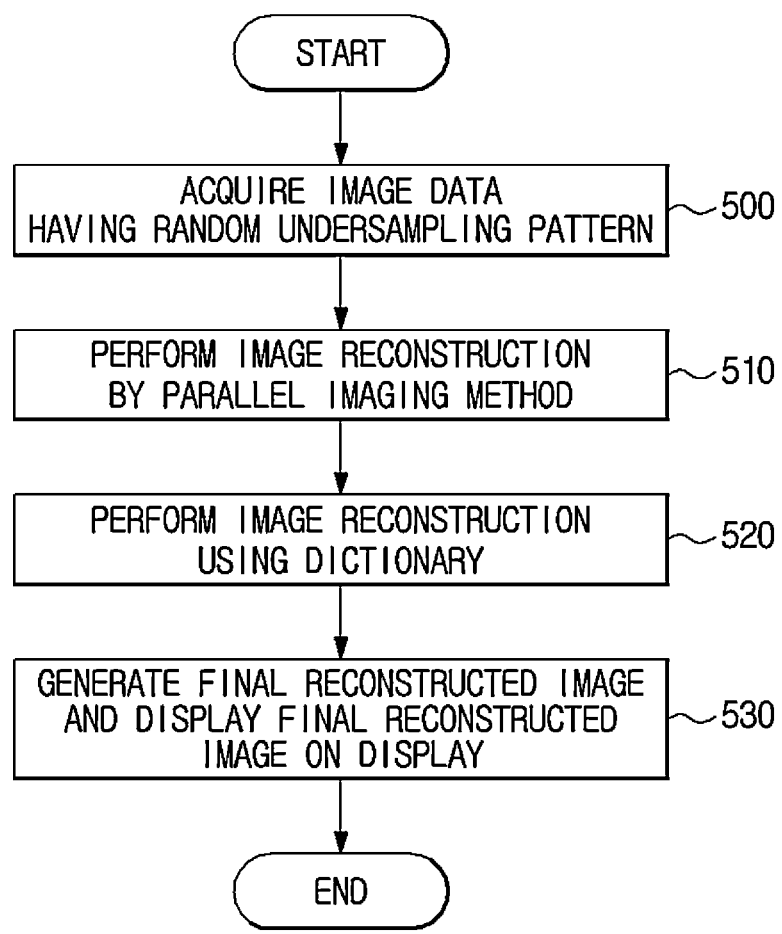
FIG. 14 is a flowchart illustrating a control method of a MRI apparatus, according to an exemplary embodiment.

FIG. 14 is a flowchart illustrating a control method of a MRI apparatus 1, according to an exemplary embodiment.

In operation 500, image data of an object, having a random undersampling pattern may be acquired, as described in detail above.

In operation 510, image reconstruction may be performed by a parallel imaging method based on the acquired image data, as described in detail above. For example, the image reconstruction may be performed by GRAPPA.

In operation 520, compressed sensing, specifically, dictionary learning compressed sensing may be applied to the first reconstructed images to perform image reconstruction again, as described in detail above.

In operation 530, a final reconstructed image may be generated from the plurality of second reconstructed images, and the final reconstructed image may be displayed on the display 112, as described in detail above.

The foregoing exemplary embodiments and advantages are merely exemplary and are not to be construed as limiting the present inventive concept. The exemplary embodiments can be readily applied to other types of devices. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
   a receive coil assembly including channels, and configured to receive an MR signal from an object;
   a data generator configured to generate undersampled image data on a k-space based on the MR signal;
   a reconstruction processor configured to generate a plurality of first reconstructed images from the undersampled image data using a parallel imaging technique, and generate a plurality of second reconstructed images using the plurality of first reconstructed images as initial values in dictionary learning compressed sensing, and combine the plurality of second reconstructed images into an image using a square sum or a complex sum, thereby generating a final reconstructed image;
   a data storage configured to store the MR signal, the undersampled image data, the plurality of first reconstructed images, the plurality of second reconstructed images and the final reconstructed image; and a display configured to display the final reconstructed image, wherein the undersampled image data includes non-uniform random undersampled image data, wherein the reconstruction processor is further configured to generate the plurality of second reconstructed images by using the dictionary learning compressed sensing by creating a global dictionary or an adaptive dictionary using a k-singular value decomposition (k-SVD), acquiring a sparse coefficient using an orthogonal matching pursuit (OMP), and performing patched reconstruction repeatedly, the dictionary learning compressed sensing being expressed by Equation (1):

$$\min_{x,D,Z} \sum_{i,j} \|R_{ij}x - Dz_{ij}\|_2^2 + \lambda \|F_u x - y\|_2^2 : \|z_{ij}\|_0 \le T_0 \ \forall \ i, j,$$

where x represents each of the plurality of second reconstructed images, y represents an original k-space corresponding to each of the plurality of second reconstructed images, $R_{ij}$ represents a function for selecting a patch, $F_u$ represents fast Fourier transform (FFT), D represents the global dictionary or the adaptive dictionary acquired through the k-singular value decomposition (k-SVD), $Z_{ij}$ represents the sparse coefficient acquired through the orthogonal matching pursuit (OMP), $\| \|_2$ represents L2-norm, $\| \|_0$ represents L0-norm, $\lambda$ represents a weight of the L2-norm, and $T_0$ represents a degree of sparsity, wherein the reconstruction processor is further configured to provide, as the plurality of second reconstructed images, images which satisfy a convergent condition of the Equation (1).

2. The MRI apparatus according to claim 1, wherein the parallel imaging technique includes at least one from among of Sensitivity Profiles From an Array of Coils for Encoding and Reconstruction in Parallel (SPACE RIP), Simultaneous acquisition of spatial harmonics (SMASH), Partially Parallel Imaging With Localized Sensitivities (PILS), and Generalized Autocalibrating Partially Parallel Acquisitions (GRAPPA).

3. The MRI apparatus according to claim 1, wherein the dictionary learning compressed sensing uses the global dictionary or the adaptive dictionary.

4. The MRI apparatus according to claim 1, wherein the data generator is further configured to generate the undersampled image data by using at least one from among a Cartesian trajectory, a radial trajectory, and a spiral trajectory.

5. The MRI apparatus according to claim 1, wherein the data generator is further configured to generate a plurality of image data in correspondence to the channels.

6. The MRI apparatus according to claim 5, wherein the reconstruction processor is further configured to generate the plurality of first reconstructed images and the plurality of second reconstructed images in correspondence to the plurality of image data.

7. A control method of a magnetic resonance imaging (MRI) apparatus, the control method comprising:

receiving an MR signal from an object by a receive coil assembly including channels;

generating an undersampled image data on a k-space based on the MR signal by a data generator;

generating a plurality of first reconstructed images from the undersampled image data using a parallel imaging technique, by a reconstruction processor;

subsequently, generating a plurality of second reconstructed images using the plurality of first reconstructed images as initial values in dictionary learning compressed sensing, by the reconstruction processor;

combining the plurality of second reconstructed images into an image using a square sum or a complex sum, thereby generating a final reconstructed image, by the reconstruction processor;

storing the MR signal, the undersampled image data, the plurality of first reconstructed images, the plurality of second reconstructed images and the final reconstructed image in a data storage; and displaying the final reconstructed image on a display, wherein the generating the undersampled image data comprises generating non-uniform random undersampled image data, wherein the generating the plurality of second reconstructed images comprises:

creating a global dictionary or an adaptive dictionary using a k-singular value decomposition (k-SVD), acquiring a sparse coefficient using an orthogonal matching pursuit (OMP), and performing patched reconstruction repeatedly, the dictionary learning compressed sensing being expressed by Equation (1):

$$\min_{x,D,Z} \sum_{i,j} \|R_{ij}x - Dz_{ij}\|_2^2 + \lambda \|F_u x - y\|_2^2 : \|z_{ij}\|_0 \le T_0 \ \forall \ i, j,$$

where x represents the each of the plurality of second reconstructed images, y represents an original k-space corresponding to the each of the plurality of second reconstructed images, $R_{ij}$ represents a function for selecting a patch, $F_u$ represents fast Fourier transform (FFT), D represents the global dictionary or the adaptive dictionary acquired through the k-singular value decomposition (k-SVD), $Z_{ij}$ represents the sparse coefficient acquired through the orthogonal matching pursuit (OMP), $\| \|_2$ represents L2-norm, $\| \|_0$ represents L0-norm, $\lambda$ represents a weight of the L2-norm, and $T_0$ represents a degree of sparsity, wherein the generating the plurality of second reconstructed images further comprises:

providing, as the plurality of second reconstructed images, images which satisfy a convergent condition of the Equation (1).

8. The control method according to claim 7, wherein the generating the plurality of first reconstructed images comprises:

generating the plurality of first reconstructed images using at least one from among Sensitivity Profiles From an Array of Coils for Encoding and Reconstruction in Parallel (SPACE RIP), Simultaneous acquisition of spatial harmonics (SMASH), Partially Parallel Imaging With Localized Sensitivities (PILS), and Generalized Autocalibrating Partially Parallel Acquisitions (GRAPPA).

9. The control method according to claim 7, wherein the generating the undersampled image data comprises:
   generating the undersampled image data using at least one of a Cartesian trajectory, a radial trajectory, or a spiral trajectory.

10. The control method according to claim 7, wherein the generating the undersampled image data comprises:
    generating a plurality of image data in correspondence to the channels.

11. The control method according to claim 10, wherein the generating the plurality of first reconstructed images comprises:
    generating the plurality of first reconstructed images in correspondence to the plurality of image data.

12. The control method according to claim 11, wherein the generating the plurality of second reconstructed images further comprises:
    generating the plurality of second reconstructed images in correspondence to the plurality of image data.

* * * * *